United States Patent
Pasadyn et al.

(10) Patent No.: US 6,732,007 B1
(45) Date of Patent: May 4, 2004

(54) METHOD AND APPARATUS FOR IMPLEMENTING DYNAMIC QUALIFICATION RECIPES

(75) Inventors: Alexander J. Pasadyn, Austin, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/164,133

(22) Filed: Jun. 5, 2002

(51) Int. Cl.[7] .............................................. G06F 19/00
(52) U.S. Cl. ........................ 700/121; 700/117; 438/14
(58) Field of Search ........................... 700/95, 109, 117, 700/121; 438/14

(56) References Cited

U.S. PATENT DOCUMENTS 5,664,987 A * 9/1997 Renteln .................... 451/21
5,866,437 A * 2/1999 Chen et al. ................. 438/14
6,197,604 B1 * 3/2001 Miller et al. ............... 438/14
6,213,848 B1 * 4/2001 Campbell et al. .......... 451/41

* cited by examiner

Primary Examiner—Jayprakash N. Gandhi
(74) Attorney, Agent, or Firm—Williams, Morgan & Amerson

(57) ABSTRACT

A method includes retrieving current state information associated with a process tool. A dynamic qualification recipe is generated based on the current state information. The dynamic qualification recipe is provided to the process tool for subsequent processing of at least one test workpiece. A system includes a process tool and a qualification recipe controller. The qualification recipe controller is configured to retrieve current state information associated with the process tool, generate a dynamic qualification recipe based on the current state information, and provide the dynamic qualification recipe to the process tool for subsequent processing of at least one test workpiece.

19 Claims, 3 Drawing Sheets

METHOD AND APPARATUS FOR IMPLEMENTING DYNAMIC QUALIFICATION RECIPES

BACKGROUND OF THE INVENTION

1. Field of the Invention

This invention relates generally to the field of semiconductor device manufacturing and, more particularly, to a method and apparatus for implementing dynamic qualification recipes.

2. Description of the Invention

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a lot of wafers using a variety of process tools, including photolithography steppers, etch tools, deposition tools, polishing tools, rapid thermal process tools, implantation tools, etc. The technologies underlying semiconductor process tools have attracted increased attention over the last several years, resulting in substantial refinements. However, despite the advances made in this area, many of the process tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of semiconductor processing line includes using a factory wide control system to automatically control the operation of the various process tools. The manufacturing tools communicate with a manufacturing framework or a network of processing modules. Each manufacturing tool is generally connected to an equipment interface. The equipment interface is connected to a machine interface which facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

Various tools in the processing line are controlled in accordance with performance models to reduce processing variation. Commonly controlled tools include photolithography steppers, polishing tools, etching tools, and deposition tools. Pre-processing and/or post-processing metrology data is supplied to process controllers for the tools. Operating recipe parameters, such as processing time, are calculated by the process controllers based on the performance model and the metrology information to attempt to achieve post-polishing results as close to a target value as possible. Reducing variation in this manner leads to increased throughput, reduced cost, higher device performance, etc., all of which equate to increased profitability.

One input to commonly used control models is the "current state" of the process tool. The "current state" represents the current set of operating parameters associated with the controlled tool. Over time, the state of the process tool may change. For example, as consumable items employed in the process tool deplete, the processing rate of the tool typically changes. Also, as a tool processes wafers, byproducts can build up in the processing chamber, affecting the state. Commonly, a process tool undergoes periodic preventative maintenance procedures or calibrations to keep the tool in optimum operating condition. For example, polishing tools include polishing pads that are periodically conditioned or replaced. Etch tools and deposition tools are periodically cleaned using both in situ cleans or complete disassembly cleans. Steppers are periodically calibrated to maintain alignment accuracy and exposure dose consistency.

Periodically, qualification recipes are performed on the tools, such as after a PM activity or an idle period, to gather information concerning the current state of the tool. These qualification recipes typically employ test wafers. The test wafers are measured after performance of the qualification recipe to determine the state of the tool. Exemplary state information for various tools includes deposition rate, polish rate, polish profile, etch rate, overlay error, etc. Typically, qualification recipes have fixed operating parameters for the tool. For example, a commonly used polishing tool includes concentric rings, each having an individual pressure setting, that apply force to the polishing surface that interfaces with the wafer being polished. The pressure settings affect the polishing rate of the polish tool and also the polishing profile (i.e., dished or domed profile). A typical qualification recipe provides a fixed set of pressure parameters. The thickness of a process layer formed on the test wafer is measured after the polishing operation to determine the blanket wafer removal rate and the polishing profile.

Over time, the state of a polishing tool may change due to changes in the slurry concentration, age of the polishing pads, effectiveness of the conditioning pad, age of the carrier, etc. During normal operation, the operating parameters of the polish tool are changed to account for these sources of variation. Often, the current state of the tool (i.e., evidenced by its current operating parameters) is different than what is tested by the qualification recipe. Accordingly, the information gathered through the performance of the qualification recipe may have reduced relevance to the current state of the tool. If the control model for the tool is initialized using the state information from the qualification procedure, the effectiveness of the process controller attempting to control the characteristics of the processed wafers may be reduced, at least in the short run. It may take a while for the controller to readjust to the sources of variation present in the tool and settle out at a stable state. The need for this settling out time reduces the effectiveness of the process control activities, and thus, tends to increase variation in the manufactured products. Increased variation generally equates to reduced profitability.

The present invention is directed to overcoming, or at least reducing the effects of, one or more of the problems set forth above.

SUMMARY OF THE INVENTION

One aspect of the present invention is seen in a method including retrieving current state information associated with a process tool. A dynamic qualification recipe is generated based on the current state information. The dynamic qualification recipe is provided to the process tool for subsequent processing of at least one test workpiece.

Another aspect of the present invention is seen in a system including a process tool and a qualification recipe controller. The qualification recipe controller is configured to retrieve current state information associated with the process tool, generate a dynamic qualification recipe based on the current state information, and provide the dynamic qualification recipe to the process tool for subsequent processing of at least one test workpiece.

BRIEF DESCRIPTION OF THE DRAWINGS

The invention may be understood by reference to the following description taken in conjunction with the accompanying drawings, in which like reference numerals identify like elements, and in which.

Figure 1:
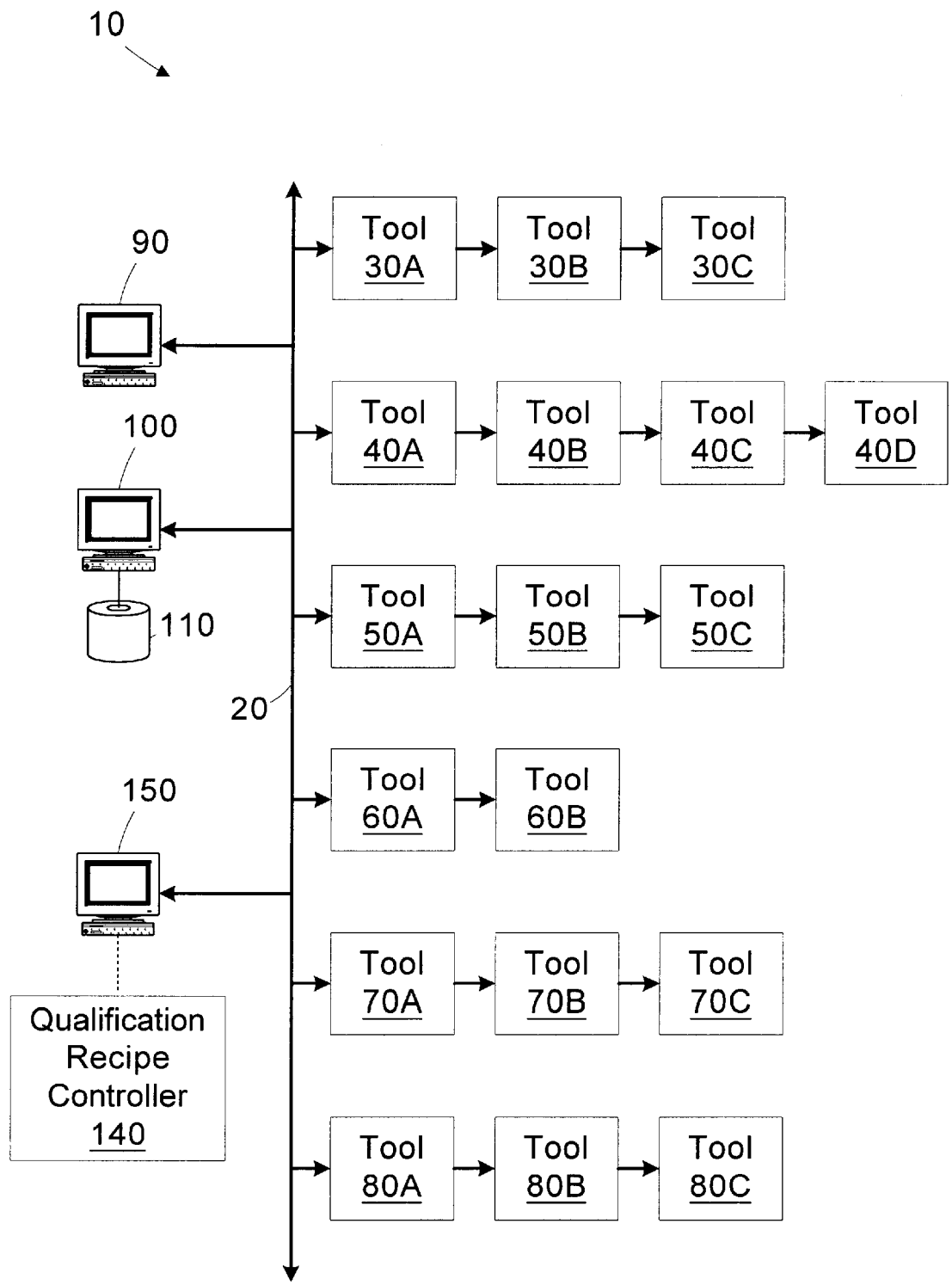
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. The techniques described herein may be applied to a variety of workpieces or manufactured items, including, but not limited to, microprocessors, memory devices, digital signal processors, application specific integrated circuits (ASICs), or other similar devices. The techniques may also be applied to workpieces or manufactured items other than semiconductor devices.

A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20. The tools 30–80 are grouped into sets of like tools, as denoted by lettered suffixes. For example, the set of tools 30A–30C represent tools of a certain type, such as a chemical mechanical planarization tool. A particular wafer or lot of wafers progresses through the tools 30–80 as it is being manufactured, with each tool 30–80 performing a specific function in the process flow. Exemplary processing tools for a semiconductor device fabrication environment include metrology tools, photolithography steppers, etch tools, deposition tools, polishing tools, rapid thermal processing tools, implantation tools, etc. The tools 30–80 are illustrated in a rank and file grouping for illustrative purposes only. In an actual implementation, the tools may be arranged in any physical order or grouping. Additionally, the connections between the tools in a particular grouping are meant to represent only connections to the network 20, rather than interconnections between the tools.

A manufacturing execution system (MES) server 90 directs high level operation of the manufacturing system 10. The MES server 90 monitors the status of the various entities in the manufacturing system 10 (i.e., lots, tools 30–80) and controls the flow of articles of manufacture (e.g., lots of semiconductor wafers) through the process flow. A database server 100 is provided for storing data related to the status of the various entities and articles of manufacture in the process flow. The database server 100 may store information in one or more data stores 110. The data may include pre-process and post-process metrology data, tool states, lot priorities, etc.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif.

The processing and data storage functions are distributed amongst the different computers or workstations in FIG. 1 to provide general independence and central information storage. Of course, different numbers of computers and different arrangements may be used without departing from the spirit and scope of the instant invention.

The manufacturing system 10 also includes a qualification recipe controller 140 executing on a workstation 150. As described in greater detail below, the qualification recipe controller 140 selects qualification recipes for the tools 30–80 that are based on the current state of the tool 30–80 being qualified. Basing the qualification recipe on the current state of the process tool increases the relevance of the data gathered from the qualification procedure. Although the MES server 90 and qualification recipe controller 140 are shown as separate entities, they may be integrated into a single unit. Similarly, the functions of the qualification recipe controller 140 described herein may be integrated into a variety of other entities in the manufacturing system 10.

Figure 2:
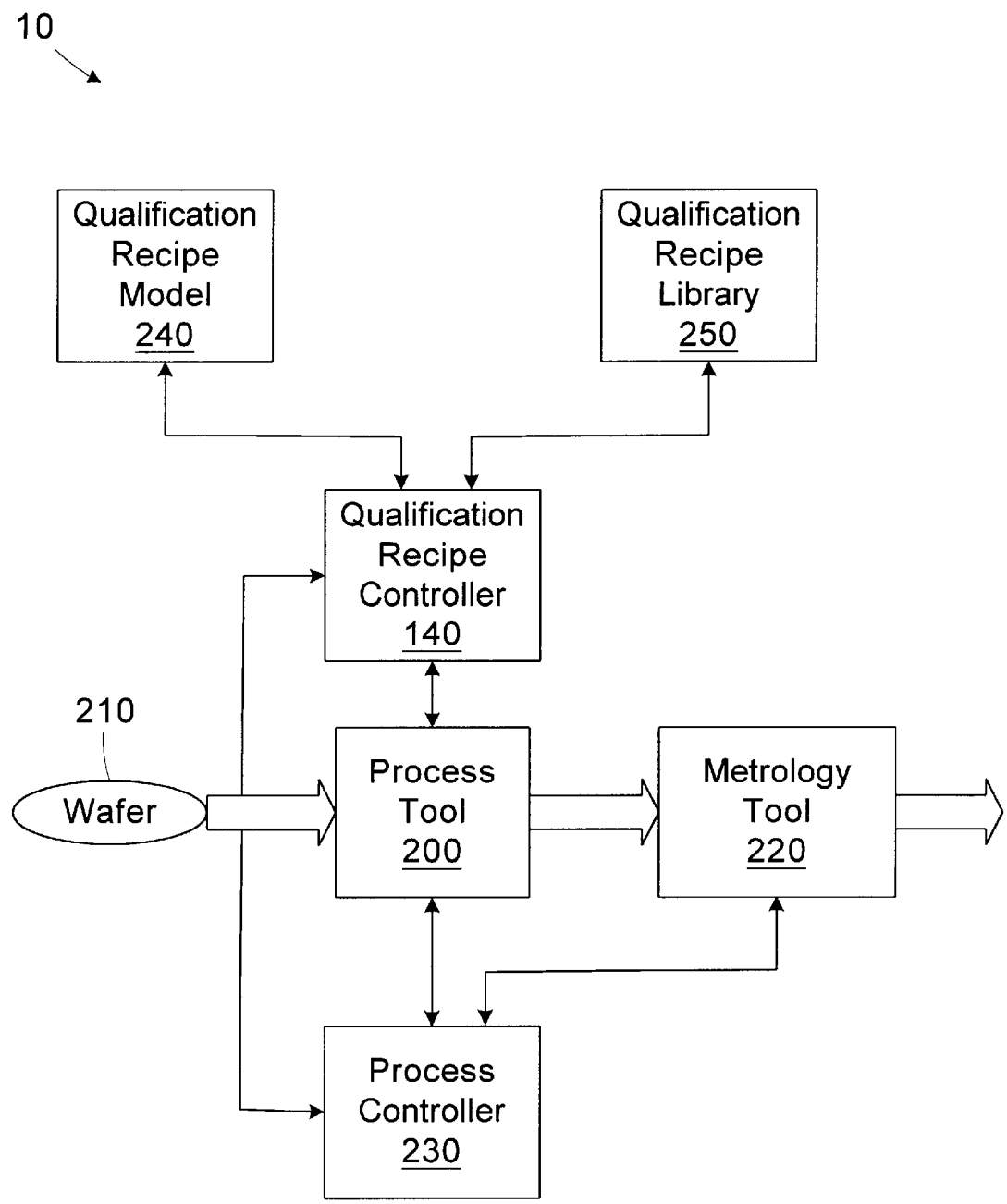
FIG. 2 is a simplified block diagram of a portion of the manufacturing system of FIG. 1.

Referring now to FIG. 2, a simplified block diagram of a portion of the manufacturing system 10 of FIG. 1 is provided. A process tool 200 (e.g., one of the tools 30–80) processes wafers 210 according to one of a plurality of operating recipes. The process tool 200 may also be a single chamber of a multiple chamber tool 30–80. A metrology tool 220 (e.g., one of the tools 30–80) measures defect characteristics of the wafers 210 processed in the process tool 200 to gauge the efficacy of the process implemented by the process tool 200. The metrology data collected by the metrology tool 220 may be passed to a process controller 230 for dynamically updating the operating recipe of the process tool 200 to reduce variation between the measured output characteristic and a target value for the characteristic. The process controller 230 thus adjusts the operating recipe parameters of the process tool 200 to account for its current state.

As described in greater detail below, the qualification recipe controller 140 receives a signal (e.g., from the MES server 90 in FIG. 1) that a qualification procedure will be performed on the process tool 200. The qualification recipe controller 140 then evaluates the current state of the process tool 200. The qualification recipe controller 140 may receive information, such as the current operating recipe parameters from the process tool 200 or the process controller 230. The qualification recipe controller 140 may also retrieve data from the data store 110 directly or through the MES Server 90. For example, the MES server 90 may provide state information to the qualification recipe controller 140 when it is notified of the need to perform the qualification procedure. The particular information needed to assess the current state of the process tool 200 may vary depending on the particular tool type. The information may include operating recipe parameters, operational characteristics of the process tool. Exemplary operational characteristics include those directly observable on the process tool 200, such as pressures, temperatures, motor currents, etc., or indirect characteristics, such as temperature, humidity, or other environmental or ambient data near or around the process tool 200.

Based on the collected state data, the qualification recipe controller 140 generates a dynamic qualification directed to gathering information relevant to the current state of the process tool 200. The process tool 200 subsequently processes test wafers (or production wafers if test wafers are not required), and the metrology tool 220 measures characteristics of the processed test wafers. The process controller 230 uses the qualification data gathered to update the control model it uses for automatically adjusting the operating recipe of the process tool 200 for production runs.

There are various techniques the qualification recipe controller 140 may employ to generate the dynamic qualification recipe. In one illustrative embodiment, the qualification recipe controller 140 may access a qualification recipe model 240 using the current state of the process tool 200 to calculate the qualification recipe parameters. Various modeling techniques, well known to those of ordinary skill in the art, are suitable for implementing the qualification recipe model 240. The qualification recipe model 240 may be developed empirically using commonly known linear or non-linear techniques. The qualification recipe model 240 may be a relatively simple equation based model (e.g., linear, exponential, weighted average, etc.) or a more complex model, such as a neural network model, principal component analysis (PCA) model, or a projection to latent structures (PLS) model. The specific implementation of the qualification recipe model 240 may vary depending on the modeling technique selected.

In another embodiment, the qualification recipe controller 140 may access a qualification recipe library 250 including a plurality of reference qualification recipes. Each reference qualification recipe has one or more associated state parameters. The qualification recipe controller 140 compares the current state of the process tool 200 to the state parameters associated with the reference qualification recipes in the qualification recipe library 250 and identifies the reference qualification recipe having the closest state parameters. Techniques for matching the current state to the states in the qualification recipe library 250 are well known to those of ordinary skill in the art, so they are not described in greater detail herein. For example, a minimum least squares or nearest neighbor approach may be used.

Although the process tool 200, qualification recipe controller 140, process controller 230, fault monitor 240, and metrology tool 220 are illustrated as separate units, they may be combined into a single unit or a different number of common units in some embodiments. The particular process performed by the process tool 200 and the particular characteristic measured by the metrology tool 220 may vary widely. The instant invention is applicable to a wide variety of process tools 200, which may be related to semiconductor or other types of processing, and the characteristic measured by the metrology tool 220 may be selected from a wide range of characteristics applicable to the particular product or workpiece being processed or the particular process being performed.

In an illustrative case, where the process tool 200 is a polishing tool, the qualification recipe controller 140 may generate a dynamic qualification recipe that incorporates the current state of the process tool 200 accounting for factors such as pad wear, slurry concentration, etc. The dynamic qualification recipe, because it is better tuned to the process tool 200 may be used to gather more refined information about the process tool 200 than would be possible with a static qualification recipe. While a static qualification recipe may be able to determine a blanket wafer removal rate, a dynamic qualification may be able to determine the polishing profile as well as the blanket rate. Hence, the dynamic qualification recipe may provide better information for updating the control model implemented by the process controller 230.

Figure 3:
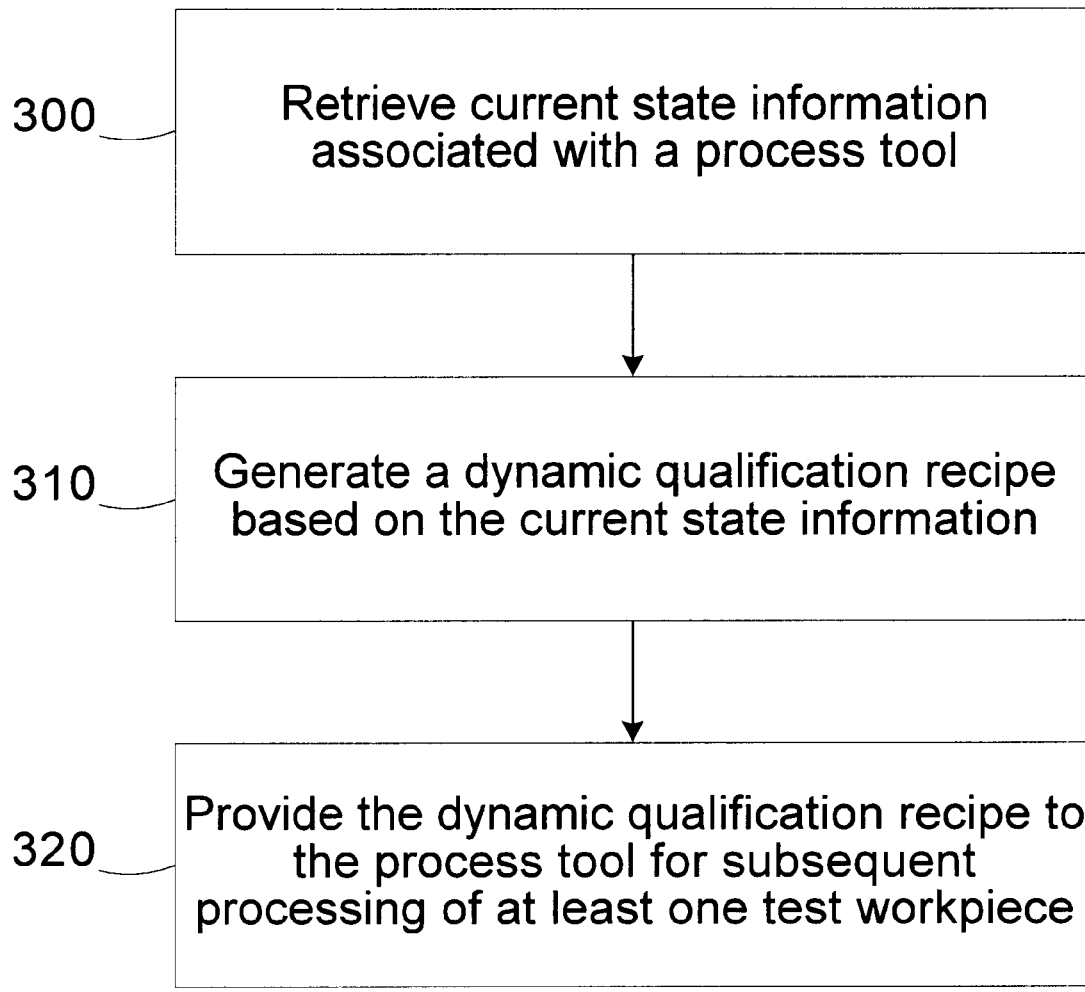
FIG. 3 is a simplified flow diagram of a method for implementing dynamic qualification recipes in accordance with another illustrative embodiment of the present invention.

Turning now to FIG. 3, a simplified flow diagram of a method for implementing dynamic qualification recipes in accordance with another illustrative embodiment of the present invention is provided. In block 300, current state information associated with a process tool is retrieved. In block 310, a dynamic qualification recipe is generated based on the current state information. In block 320, the dynamic qualification recipe is provided to the process tool for subsequent processing of at least one test workpiece The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   retrieving current state information associated with a process tool;
   generating a dynamic qualification recipe based on the current state information; and
   providing the dynamic qualification recipe to the process tool for subsequent processing of at least one test workpiece.

2. The method of claim 1, further comprising measuring qualification data associated with the processed test workpiece.

3. The method of claim 2, further comprising updating a control model used to control the process tool based on the measured qualification data.

4. The method of claim 3, further comprising:
   processing production workpieces in the tool; and
   controlling the processing of the production workpieces in accordance with the updated control model.

5. The method of claim 1, wherein retrieving the current state information further comprises retrieving a current operating recipe implemented by the process tool.

6. The method of claim 1, wherein retrieving the current state information further comprises retrieving an operational characteristic associated with the operation of the process tool.

7. The method of claim 1, wherein retrieving the current state information further comprises retrieving an ambient characteristic associated with the process tool.

8. The method of claim 1, wherein generating the dynamic qualification recipe further comprises:
   comparing the current state information to a library of reference qualification recipes, each reference qualification recipe having at least one associated state parameter;
   selecting the reference qualification recipe having the associated state parameter closest to the current state information; and
   defining the dynamic qualification recipe based on the selected the reference qualification recipe.

9. The method of claim 1, wherein generating the dynamic qualification recipe further comprises applying a qualification recipe model to the current state information.

10. A system, comprising:
    a process tool; and
    a qualification recipe controller configured to retrieve current state information associated with the process tool, generate a dynamic qualification recipe based on the current state information, and provide the dynamic qualification recipe to the process tool for subsequent processing of at least one test workpiece.

11. The system of claim 10, further comprising a metrology tool configured to measure qualification data associated with the processed test workpiece.

12. The system of claim 11, further comprising a process controller configured to update a control model used to control the process tool based on the measured qualification data.

13. The system of claim 10, wherein the qualification recipe controller is configured to retrieve a current operating recipe implemented by the process tool.

14. The system of claim 10, wherein qualification recipe controller is configured to retrieve an operational characteristic associated with the operation of the process tool.

15. The system of claim 10, wherein qualification recipe controller is configured to retrieve an ambient characteristic associated with the process tool.

16. The system of claim 10, wherein qualification recipe controller is configured to compare the current state information to a library of reference qualification recipes, each reference qualification recipe having at least one associated state parameter, select the reference qualification recipe having the associated state parameter closest to the current state information, and define the dynamic qualification recipe based on the selected the reference qualification recipe.

17. The system of claim 10, wherein qualification recipe controller is configured to apply a qualification recipe model to the current state information to generate the dynamic qualification recipe.

18. The system of claim 10, wherein the process tool is further configured to process production workpieces in the tool, and the process controller is further configured to control the processing of the production workpieces in accordance with the updated control model.

19. A system, comprising:
    means for retrieving current state information associated with a process tool,
    means for generating a dynamic qualification recipe based on the current state information; and
    means for providing the dynamic qualification recipe to the process tool for subsequent processing of at least one test workpiece.

* * * * *